(12) United States Patent
Makabe

(10) Patent No.: US 10,505,013 B2
(45) Date of Patent: Dec. 10, 2019

(54) PROCESS OF FORMING EPITAXIAL SUBSTRATE HAVING N-POLAR GALLIUM NITRIDE

(71) Applicant: SUMITOMO ELECTRIC INDUSTRIES, LTD., Osaka (JP)

(72) Inventor: Isao Makabe, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/041,214

(22) Filed: Jul. 20, 2018

(65) Prior Publication Data

US 2019/0027577 A1 Jan. 24, 2019

(30) Foreign Application Priority Data

Jul. 21, 2017 (JP) .................. 2017-141960

(51) Int. Cl.
| | |
|---|---|
| H01L 29/66 | (2006.01) |
| H01L 29/778 | (2006.01) |
| H01L 21/56 | (2006.01) |
| H01L 29/20 | (2006.01) |
| H01L 29/417 | (2006.01) |
| H01L 29/51 | (2006.01) |
| H01L 29/04 | (2006.01) |

(52) U.S. Cl.
CPC ...... *H01L 29/66462* (2013.01); *H01L 21/568* (2013.01); *H01L 29/7781* (2013.01); *H01L 29/7787* (2013.01); *H01L 29/045* (2013.01); *H01L 29/2003* (2013.01); *H01L 29/41766* (2013.01); *H01L 29/518* (2013.01)

(58) Field of Classification Search
CPC .................. H01L 26/66462; H01L 26/66431
See application file for complete search history.

(56) References Cited

U.S. PATENT DOCUMENTS

| | | | |
|---|---|---|---|
| 2010/0051939 A1* | 3/2010 | Shinagawa | H01S 5/32341 |
| | | | 257/43 |
| 2013/0077352 A1 | 3/2013 | Shimizu et al. | |

FOREIGN PATENT DOCUMENTS

| | | |
|---|---|---|
| JP | 2000-277724 | 10/2000 |
| JP | 2011-3808 | 1/2011 |
| WO | 2011/132284 | 10/2011 |

* cited by examiner

*Primary Examiner* — Yu-Hsi D Sun
(74) *Attorney, Agent, or Firm* — Smith, Gambrell & Russell, LLP.

(57) ABSTRACT

A process of forming a high electron mobility transistor (HEMT) with a reverse arrangement for the barrier layer and the channel layer thereof is disclosed. The process includes steps of epitaxially growing an oxide layer containing zinc (Zn) on a substrate where the oxide layer shows an O-polar surface; epitaxially growing a semiconductor stack made of nitride semiconductor materials on the oxide layer where the semiconductor stack includes a nitride semiconductor layer, a barrier layer and a channel layer on the oxide layer in this order; attaching a temporal substrate to the semiconductor stack; removing the substrate and the oxide layer from the semiconductor stack; attaching a support substrate to the nitride semiconductor layer; and removing the temporal substrate from the semiconductor stack.

16 Claims, 7 Drawing Sheets

PROCESS OF FORMING EPITAXIAL SUBSTRATE HAVING N-POLAR GALLIUM NITRIDE

CROSS REFERENCE TO RELATED APPLICATION

The present application is based on and claims the benefit of priority of Japanese Patent Application No. 2017-141960, filed on Jul. 21, 2017, the entire content of which is incorporated herein by reference.

BACKGROUND OF INVENTION

1. Field of Invention

The present invention relates to a process of forming an epitaxial substrate, in particular, the epitaxial substrate with an N-polar gallium nitride (GaN), and a process of forming a high electron mobility transistor (HEMT) using the epitaxial substrate where the HEMT has a reversed arrangement between a barrier layer and a channel layer.

2. Background Arts

A Japanese Patent Application laid open No. JP2000-277724 A has disclosed a HEMT primarily made of nitride semiconductor materials and having a reversed arrangement between the barrier layer and the channel layer. The HEMT disclosed therein has a buffer layer made of gallium nitride (GaN) grown on a sapphire substrate at relatively lower temperature, an n-type barrier layer made of aluminum gallium nitride (AlGaN) grown on the buffer layer, an un-doped channel layer made of GaN grown on the n-type AlGaN barrier layer, and a contact layer made of n-type GaN grown on the un-doped GaN layer. The HEMT induces a two dimensional electron gas (2DEG) at an interface between the AlGaN barrier layer and the GaN channel layer.

An International Patent Application laid open No. WO2011/132284 has disclosed another HEMT whose operation mode is, what is called, a normally OFF. This HEMT provides an i-type (intrinsic type) GaN layer grown on a substrate, an n-type AlGaN layer grown on the i-type GaN layer, an i-type AlGaN layer grown on the n-type AlGaN layer, and another i-type GaN layer grown on the i-type AlGaN layer. The i-type GaN layer exposes an N-polar surface. The 2DEG is induced in the interface between the i-type GaN layer and the i-type AlGaN layer.

Another Japanese Patent application laid open No. JP2011-003808 A has disclosed a process for forming a GaN substrate with an N-polar surface. The process disclosed therein first grown a GaN layer with a Ga-polar surface, then cuts Ga—N bonds at a specific depth by implanting protons (H+) with huge dosage by the specific depth. Attaching a silicon substrate to the grown GaN layer interposing a silicon oxide film, and dividing the GaN substrate at a portion implanted with protons, a GaN layer with the N-polar surface may be left on the Si substrate.

Electron devices such as a HEMT primarily made of nitride semiconductor materials have been practically and commercially available in the field. Because of wide bandgap energy of nitride semiconductor materials, such devices may make high frequency performances consistent with high breakdown voltages. An ordinary HEMT provides a GaN channel layer on a substrate, a barrier layer made of, for instance, aluminum gallium nitride (AlGaN), provided on the GaN channel layer, and electrodes of a gate, a drain, and a source on the AlGaN barrier layer. Such a HEMT forms a two dimensional electron gas (2DEG) in the GaN channel layer at an interface against the AlGaN barrier layer.

A HEMT with another arrangement has been investigated, where the other arrangement reverses the channel layer against the barrier layer. That is, the GaN channel layer is provided on the barrier layer, and the 2DEG is formed in a side of the electrodes viewing from the barrier layer. The HEMT with the reversed arrangement in the barrier layer and the channel layer may connect the 2DEG with the electrode without interposing the barrier layer, which may reduce not only access resistance from the electrode to the 2DEG but a leak current flowing in the substrate and the buffer layer provided directly on the substrate; because the barrier layer with greater bandgap energy is interposed between the 2DEG and the substrate or the buffer layer.

However, the HEMT with the reversed arrangement leaves following subjects. That is, in order to induce the 2DEG in the channel layer and the barrier layer, the channel layer is necessary to show the Ga-polar surface at the interface against the barrier layer, which means that the barrier layer is necessary to have the N-polar surface at the interface against the channel layer. However, a nitride semiconductor material is hard or almost impossible to show the N-polar surface thereof during the epitaxial growth because the N-polar surface generally shows lesser diffusion lengths for group III materials, which results in lesser crystal quality of a layer grown on the N-polar surface. The prior document above described has disclosed a technique, which is often called as the smart-cut technique, but this technique uses the proton implantation with huge dosage, which inevitably results in in a roughed surface inadequate for the subsequent epitaxial growth.

SUMMARY OF INVENTION

An aspect of the present invention is a process of forming an epitaxial substrate for a high electron mobility transistor (HEMT) with the reverse arrangement for the channel layer and the barrier layer thereof. The process includes steps of: (a) epitaxially growing an oxide layer containing zinc (Zn) on a substrate, the oxide layer showing an O-polar surface; (b) epitaxially growing a semiconductor stack made of nitride semiconductor materials on the oxide layer, the semiconductor stack including a nitride semiconductor layer, a barrier layer, and a channel layer, the barrier layer having bandgap energy greater than bandgap energy of the nitride semiconductor layer and bandgap energy of the channel layer, the semiconductor stack showing an N-polar surface; (c) attaching a temporal substrate to the semiconductor stack; (d) removing the substrate and the oxide layer from the semiconductor stack; (e) attaching a support substrate to the nitride semiconductor layer; and (f) removing the temporal substrate from the semiconductor stack.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, embodiments according to the present invention will be described as referring to accompanying drawings. The present invention, however, is not restricted to those embodiments, and may have a scope defined in the claims and include all modifications and changes equivalent to those defined in the claims. Also, in the description of the drawings, numerals or symbols same with or similar to each other will refer to elements same with or similar to each other without duplicating explanations.

First Embodiment

Figure 1:
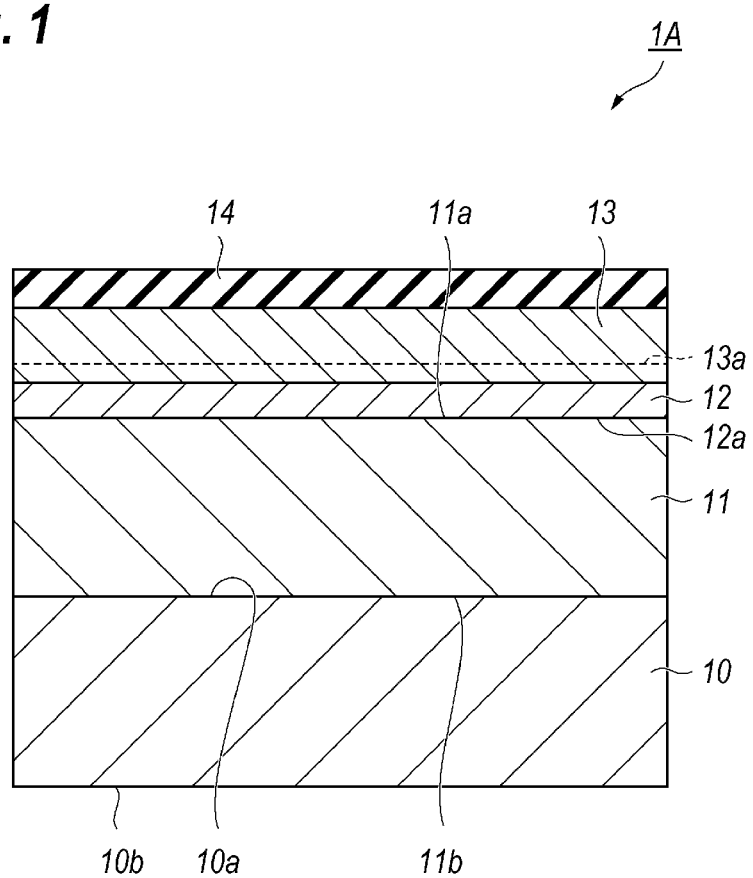
FIG. 1 schematically illustrates a cross section of an epitaxial substrate according to an embodiment of the present invention.

FIG. 1 schematically illustrates a cross section of an epitaxial substrate 1A formed by a process according to an embodiment of the present invention. The epitaxial substrate 1A, which has a slab shape with a nitride semiconductor material on a top thereof, includes a substrate 10 and a nitride semiconductor layer 11, a barrier layer 12, a channel layer 13, and an insulating film 14 on the substrate 10 in this order. The nitride semiconductor layer 11 is the first nitride semiconductor layer in the present invention, while, the barrier layer 12 is the second nitride semiconductor layer and the channel layer 13 is the third nitride semiconductor layer in the present invention.

Figure 2:
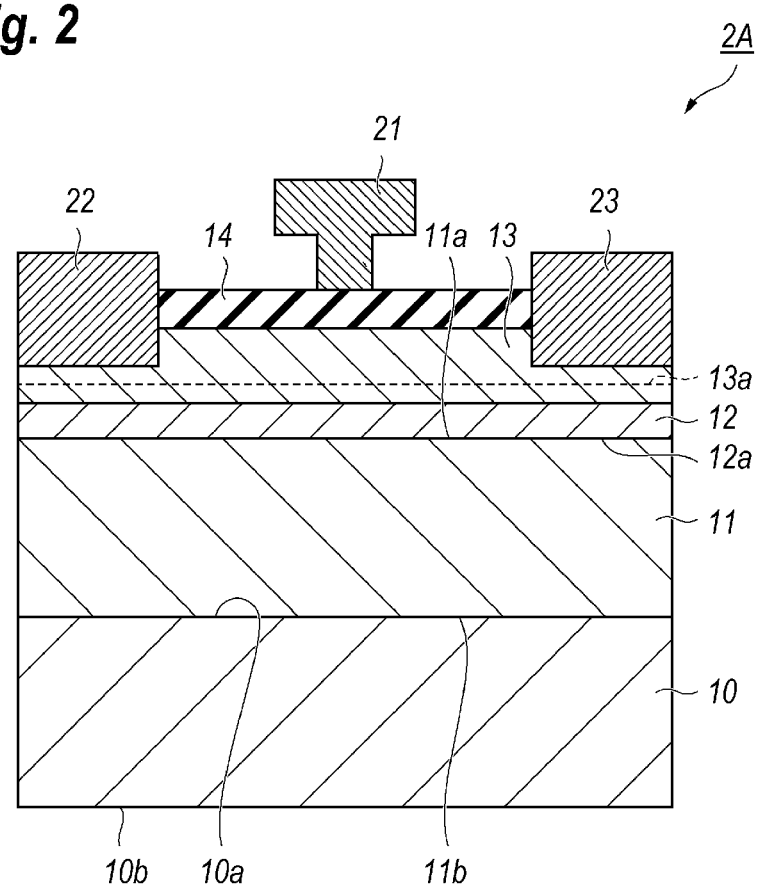
FIG. 2 schematically illustrates a cross section of a high electron mobility transistor (HEMT) formed on the epitaxial substrate shown in FIG. 1.

FIG. 2 also schematically shows a cross section of a high electron mobility transistor (HEMT) 2A formed on the epitaxial substrate 1A shown in FIG. 1. The HEMT 2A has a structure of, what is called, a reversed HEMT; specifically, the barrier layer 12 is provided under the channel layer 13 with respect to electrodes. The HEMT 2A provides a gate electrode 21, a source electrode 22, and a drain electrode 23 on the epitaxial substrate 1A. A reverse HEMT may be effectively applicable to a radio frequency (RF) amplifier in the S-band to the X-band (2 to 12 GHz), especially between local stations of the mobile phone system.

The support substrate 10, which may be made of slab material having electrically insulating or semi-insulating characteristic, provides a top surface 10a and a back surface 10b opposite to the top surface 10a. The support substrate 10 may be made of material or materials not restricted to those for an epitaxial growth of nitride semiconductor materials thereon. For instance, a substrate made of silicon (Si), silicon carbide (SiC), aluminum nitride (AlN), and/or sintered body may be used as the substrate 10.

The nitride semiconductor layer 11 provides a surface 11b attached to the top surface 10a of the support substrate 10 and another surface 11a opposite to the former surface 11b. The nitride semiconductor layer 11 may be attached to the support substrate 10 directly or indirectly as interposing, for instance, a film made of silicon nitride (SiN) and/or silicon oxide ($SiO_2$). The nitride semiconductor layer 11, which is made of nitride semiconductor materials epitaxially grown on a substrate independent of the support substrate 10, may be, for instance, a gallium nitride (GaN) layer. The surface 11a is, what is called, the N-polar surface; while, the other surface is, what is called, the Ga-polar surface. The nitride semiconductor layer 11 may have a thickness greater than 0.3 µm, preferably greater than 0.5 µm but thinner than 2.0 µm, preferably thinner than 1.5 µm. The present embodiment shown in FIG. 1 and FIG. 2 provides the nitride semiconductor layer 11 with a thickness of 1.0 µm and has a semi-insulating characteristic.

The barrier layer 12, which is grown on the nitride semiconductor layer 11, shows a function of, what is called, an electron-supplying layer. The barrier layer 12 may be made of nitride semiconductor material such as AlGaN, InAlN, and/or InAlGaN whose bandgap energy is greater than that of the nitride semiconductor layer 11. The barrier layer 12 provides a surface 12a, which forms an interface against the surface 11a of the nitride semiconductor layer 11, that exposes group III elements such as aluminum (Al), gallium (Ga), and/or indium (In). The barrier layer 12 preferably has a thickness of 10 to 50 nm, where the thickness of the barrier layer 12 in the present embodiment is 30 nm. When the barrier layer 12 is made of $Al_xGa_{1-x}N$, an aluminum composition x is 0.15 to 0.35, where the present embodiment is 0.2. The barrier layer 12 may be undoped, or doped in the n-type conduction.

The channel layer 13, which is epitaxially grown on the barrier layer 12 and doped with the n-type impurities, may be made n-type GaN. The channel layer 13 provides the bandgap energy smaller than that of the barrier layer 12. The channel layer 13 has a thickness greater than 5 nm but thinner than 100 nm, preferably thinner than 20 nm. The channel layer 13 and the barrier layer 12 may cause a stress due to lattice mismatching between two materials forming the respective layers, 12 and 13, which induces piezo charges in an interface therebetween. Thus, the two layers, 12 and 13, may form a two dimensional electron gas (2DEG) in the channel layer 13 at the interface against the barrier layer 12, which forms the channel 13a to transport carriers, namely electrons. The channel layer 13 may have semi-insulating characteristic.

The insulating film 14, which protects the nitride semiconductor layer 11, the barrier layer 12, and the channel layer 13, may be made of inorganic material containing silicon (Si), typically silicon nitride (SiN). The insulating film 14 preferably has a thickness of 10 to 100 nm, where the present embodiment provides the insulating film 14 with a thickness of 50 nm. The epitaxial substrate 1A may omit the insulating film 14 depending on applications thereof.

The source electrode 22 and the drain electrode 23 are provided on the channel layer 13 and in contact with the channel layer 13, as shown in FIG. 2. The source and drain electrodes, 22 and 23, may be formed by alloying stacked metals of titanium (Ti) and aluminum (Al). The insulating film 14 provided between the source and drain electrodes, 22 and 23, may reduce the gate leak current. The gate electrode 21, which is provided on the insulating film 14 between the source electrode 22 and the drain electrode 23, may be stacked metals of nickel (Ni) and gold (Au), where Ni is in contact with the insulating film 14. Thus, the HEMT 2A of the present embodiment has the arrangement of, what is called, the metal-insulator-semiconductor field effect transistor (MISFET).

Next, the process of forming the epitaxial substrate 1A and the HEMT 2A will be described referring to figures. From FIG. 3A to FIG. 5B schematically illustrate cross sections of the epitaxial substrate 1A and the HEMT 2A at respective steps of the process.

The process first prepares a substrate 15 having a plane surface 15a for growing an oxide layer 16 and semiconductor layers, 11 to 13, thereon. The substrate 15 may be made of sapphire ($Al_2O_3$) but not restricted to sapphire. Various other materials are applicable as the substrate 15 as far as the substrate 15 provides a surface on which those layers 11 to 13 and 16 are able to be grown thereon, where materials with a hexagonal crystal structure are preferable. The plane surface 15a may have a surface orientation of (0001), which is often called as the c-plane, or another surface orientation of (11-20), which is called as the a-plane.

Then, the epitaxial growth of an oxide layer 16 is carried out. The oxide layer 16 may include zinc (Zn), typically zinc oxide (ZnO), or zinc oxide containing at least one of magnesium (Mg) and cadmium (Cd), where the former is denoted as ZnMgO, while, the latter is written as ZnCdO. Such oxide layer 16 may be deposited by the molecular beam epitaxy (MBE) technique, the pulsed laser deposition (LPD) technique, and/or the sputtering. Essential and important point of the present invention is that the oxide layer 16 shows an O-polar surface. Evacuating a chamber at which the ZnO is grown to, for instance, $1\times10^{-7}$ Torr ($1.33\times10^{-8}$ kPa) and raising a temperature of the substrate 15 to a range of 300 to 800° C., the ZnO film may be grown with a thickness of 200 to 400 nm, preferably 300 nm in the present embodiment, using a zinc source with purity of six-nines (99.9999%) and oxygen radicals provided from an oxygen radical gun.

Thereafter, the process epitaxially grows the nitride semiconductor layer 11 on the oxide layer 16 by the metal organic chemical vapor deposition (MOCVD) technique. As described, the nitride semiconductor layer 11 is made of GaN. Because oxygen (O) atoms are easily sublimated from the surface of the oxide layer 16 under conditions of a high temperature and a hydrogen atmosphere, the epitaxial growth for the semiconductor layer 11 at least in an initial stage thereof is preferably carried out at a relatively lower temperature and an atmosphere of nitrogen and/or an inactive gas. The growth temperature for the nitride semiconductor layer 11 is preferably from 800 to 1200° C., the growth pressure thereof is around 100 Torr (13.3 kPa). Also, source materials are preferably Tri-Methyl-Gallium (TMG) and ammonia ($NH_3$) with flow rates of 20 sccm and 10 slm, respectively.

Growing the nitride semiconductor layer 11 on the O-polar surface of the oxide layer 16 containing Zn, the nitride semiconductor layer 11 may be grown as exposing the N-polar surface thereof even the surface 15a of the substrate 15 has the c-plane. Accordingly, the surface of the nitride semiconductor layer 11 becomes the N-polar surface.

Some specific growth conditions will be described when the oxide layer 16 is made of ZnO and the nitride semiconductor layer 11 is made of GaN. The process first treats the surface 15a of the substrate at 700° C. after loading the substrate 15 within the growth chamber of a molecular beam epitaxy (MBE). Cooling the temperature of the substrate 15 down to, for instance, lower than 300° C., a buffer layer made of ZnO with a thickness of 50 nm, which is a portion of the ZnO oxide layer 16, is grown on the substrate 15. Thereafter, a rest portion of the ZnO oxide layer 16 is grown by a thickness of around 300 nm after raising the temperature of the substrate 15 to, for instance, 650 to 750° C., preferably 700° C. Then, transferring the substrate 15 within a chamber of an MOCVD apparatus from the MBE chamber, setting the temperature to be 650° C., the nitride semiconductor layer in a first portion thereof is grown by about 50 nm as a buffer layer. Thereafter, changing a carrier gas from nitrogen ($N_2$) to hydrogen ($H_2$) and raising the temperature of the substrate 15 to 1000° C., a second portion of the nitride semiconductor layer 11 made of GaN is grown. Because the growth of the nitride semiconductor layer 11 is carried out at a relative lower temperature, for instance 650° C., in an initial stage thereof; the sublimation of oxygen atoms by ammonia ($NH_3$) may be effectively suppressed and the nitride semiconductor layer 11 may enhance the crystal quality thereof. The low temperature growth of the buffer layer for the nitride semiconductor layer 11 may be carried out under a temperature, for instance, higher than 600° C. but lower than 800° C.

Thereafter, the process may epitaxially grow the barrier layer 12 of the nitride semiconductor layer 11 by the MOCVD technique. As described, the barrier layer 12 may be made of AlGaN, InAlN, and/or, InAlGaN. In a case of the AlGaN barrier layer, the growth conditions thereof may be a temperature higher than 900° C. but lower than 1100° C., the pressure of 50 Torr (6.7 kPa), and source materials of Tri-Methyl-Aluminum (TMA), TMG and $NH_3$ with flow rates of 30 sccm, 15 sccm, and 10 slm, respectively. The growth temperature for the AlGaN barrier layer 12 may be substantially same with that for the growth of the nitride semiconductor layer 11 of the second portion thereof.

Thereafter, the channel layer 13 is grown on the barrier layer 12 by the MOCVD technique at a temperature 900 to 1200° C. and a growth pressure of 150 Torr (20.0 kPa), where the channel layer 13 may be made of GaN. Source materials are, when the channel layer 13 is made of GaN, TMG and $NH_3$ with flow rates of 30 sccm and 10 slm, respectively. The process may form the insulating film 14 continuous to the growth of the semiconductor layers 11 to 13 without exposing the substrate 15 and the semiconductor layers, 11 to 13, to air.

Figure 3A:
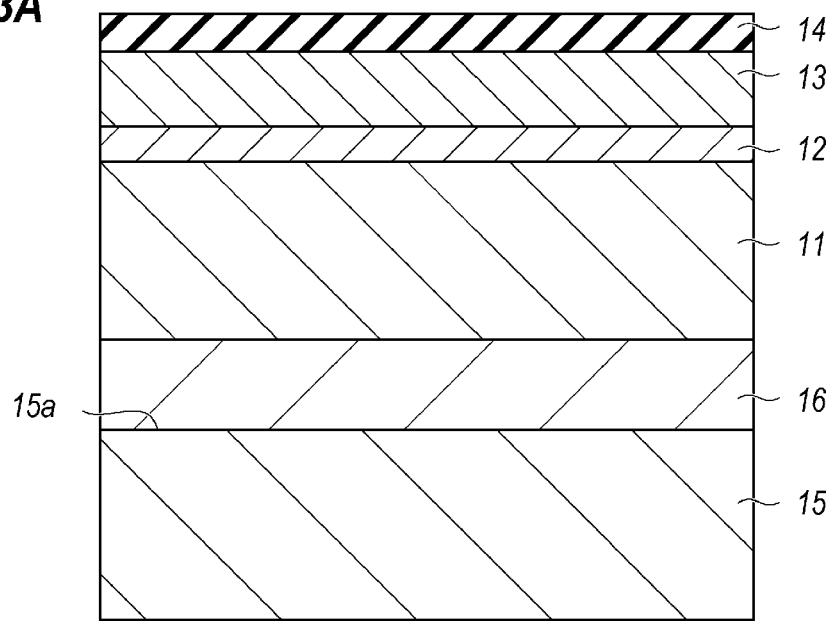
FIG. 3A and FIG. 3B show processes of forming the HEMT shown in FIG. 2.
Figure 3B:
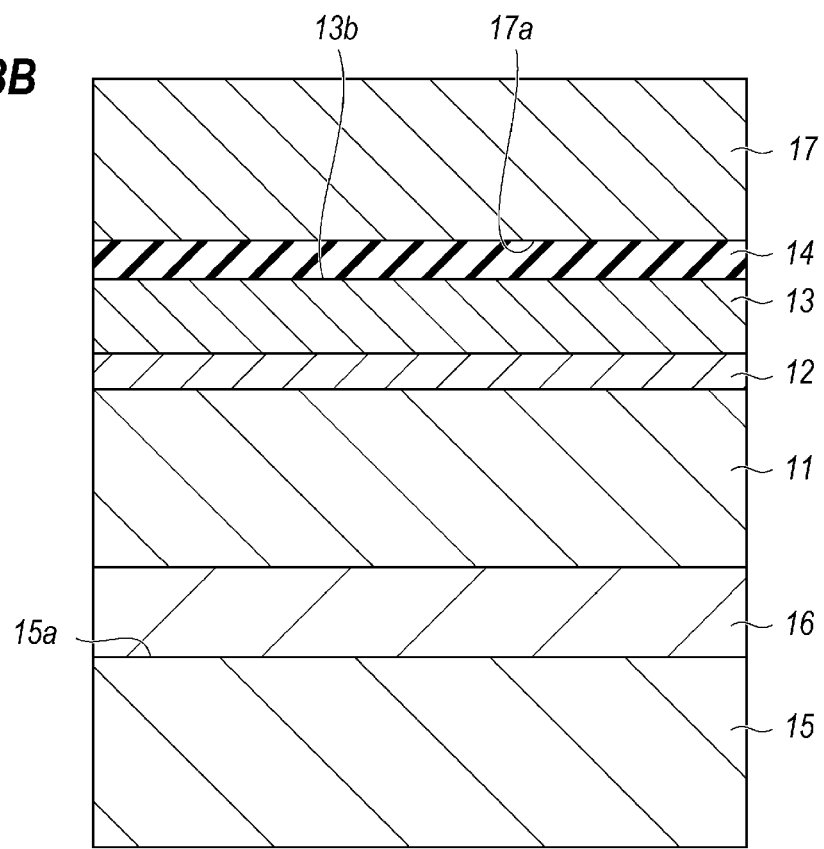

Thereafter, as shown in FIG. 3B, a temporal substrate 17 in a plane surface 17a thereof is attached to the surface 13b, or the surface of the insulating film 14, with an adhesive. The temporal substrate 17, which reinforce mechanical strength of the epitaxial semiconductor layers, 11 to 13, may be made of, for instance, silicon (Si).

Figure 4A:
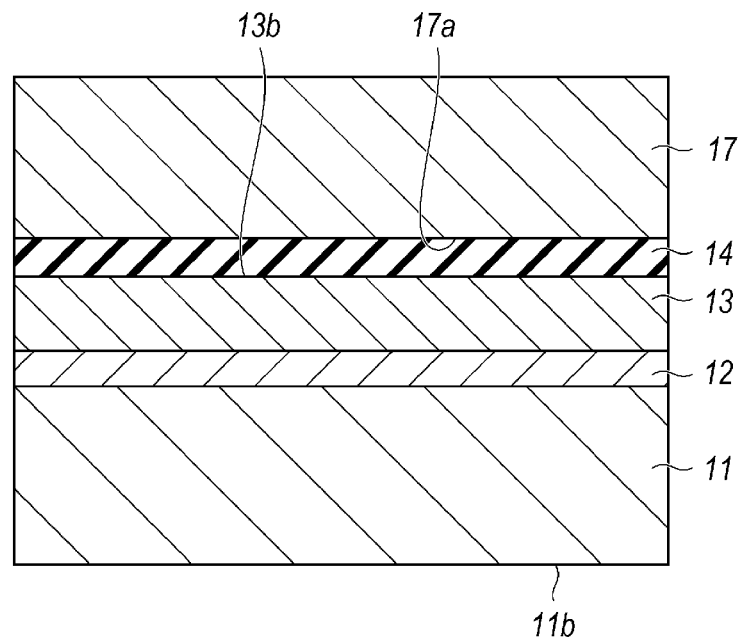
FIG. 4A and FIG. 4B show processes subsequent to that shown in FIG. 3B.

Thereafter, the substrate 15 is detached from the semiconductor epitaxial layers, 11 to 13, by etching the oxide layer 16, which exposes the back surface 11b of the nitride semiconductor layer 11, as shown in FIG. 4A. The back surface 11b make an interface against the oxide layer 16. A solution of phosphoric peroxide ($H_3PO_4$, $H_2O_2$, $H_2O$) or other solutions ordinarily used for etching semiconductor materials such as diluted citric acid, diluted aconitic acid, acetic acid, and so on are used as an etchant for the oxide layer 16 made of ZnO.

Figure 4B:
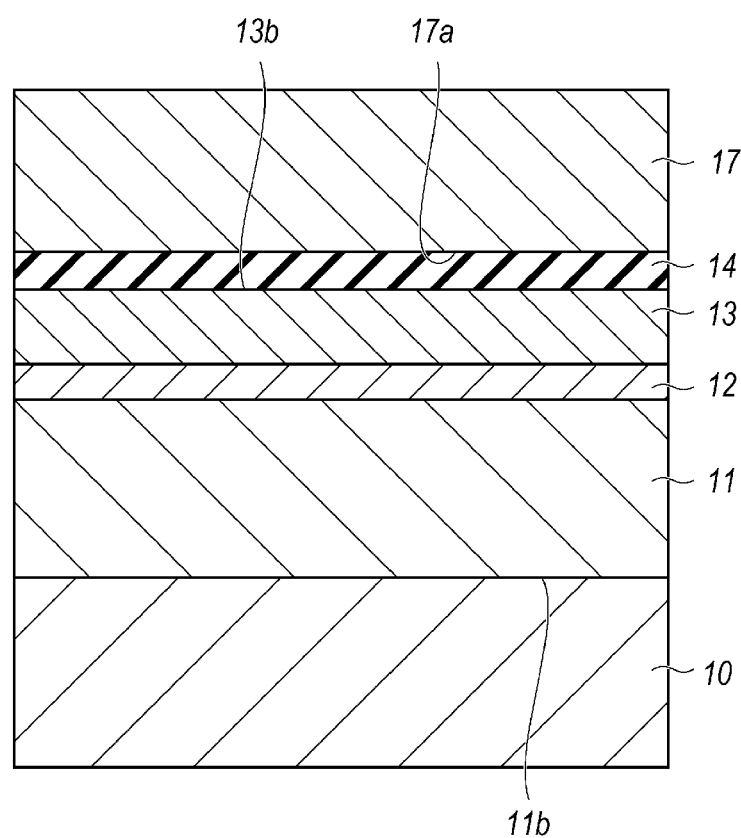
Figure 5A:
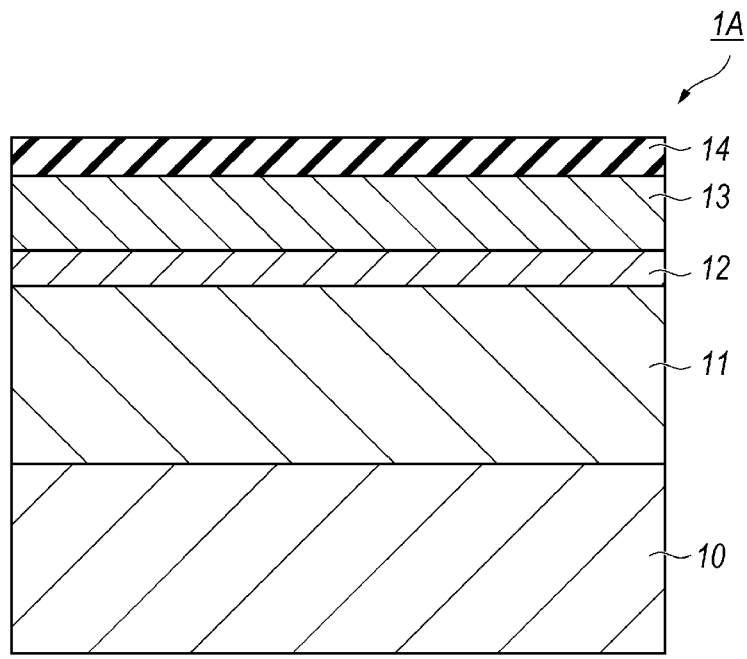
FIG. 5A and FIG. 5B show processes subsequent to that shown in FIG. 4B.

Thereafter, as shown in FIG. 4B, a support substrate 10 is attached to the surface 11b of the nitride semiconductor layer 11. The support substrate 10 may be made of silicon (Si) same with the temporal substrate 17 on the top of the insulating film 14. The attachment of the substrate 10 to the semiconductor layer 11 interposes a film made of silicon oxide ($SiO_2$) therebetween. Specifically, the support substrate 10 may provide the $SiO_2$ film thereon, and this $SiO_2$ film is attached to the surface 11b of the nitride semiconductor layer 11. Thereafter, the temporal substrate 17 on the top of the insulating film 14 is removed by, for instance, melting the adhesive applied between the insulating film 14 and the temporal substrate 17, which exposes the top surface of the insulating film 14, as shown in FIG. 5A. Steps from that shown in FIG. 3B to that shown in FIG. 4B replace a substrate for reinforcing the epitaxial layers, 11 to 13, from the substrate 15 to the Si substrate 10.

Figure 5B:
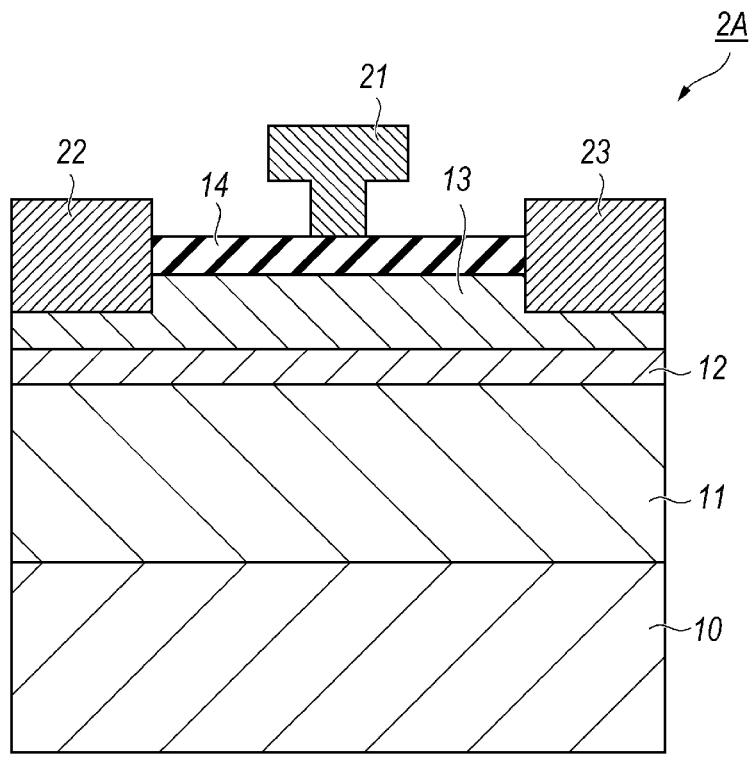

Thereafter, the HEMT 2A may be formed. As shown in FIG. 5B, partially removing the insulating film 14 and the channel layer 13, the source electrode 22 and the drain electrode 23 are formed on surfaces of the channel layer 13 exposed by the partial etching. The gate electrode 21 may be formed on the insulating film 14 between the source and drain electrodes, 22 and 23. The source and drain electrodes, 22 and 23, may be formed by ordinary photolithography and a metal lift-off technique subsequent to the photolithography.

Figure 7A:
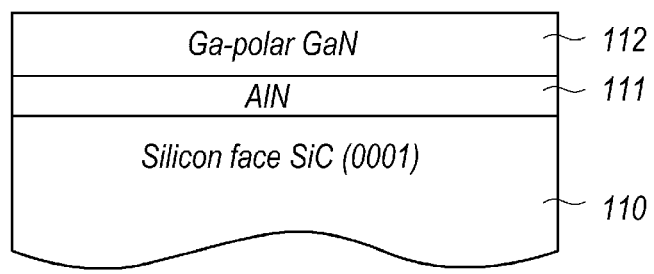
FIG. 7A schematically illustrate a status where a channel layer made of gallium nitride (GaN) grown on a C-face of a substrate made of silicon carbide (SiC) interposing a buffer layer made of aluminum nitride (AlN), and FIG. 7B also illustrates another status where the GaN channel layer is grown on a Si-face of the SiC substrate interposing the AlN buffer layer.
Figure 7B:
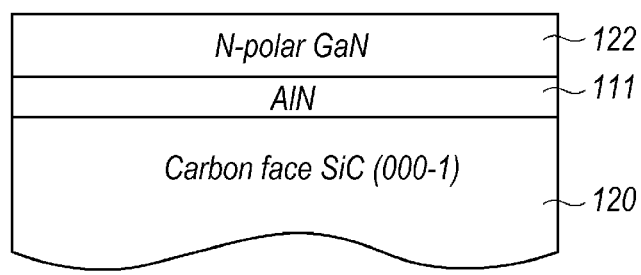

Advantages of the epitaxial substrate 1A formed by the process according to the present embodiment will be described comparing with a conventional technique. FIG. 7A schematically illustrates an epitaxial substrate provided on a primary surface of a substrate made of SiC 110, where the primary surface of the SiC 110 is the crystallographic orientation of (0001), which is often called as the c-plane. The epitaxial substrate shown in FIG. 7A includes a nucleus forming layer 111 made of aluminum nitride (AlN) grown on the SiC substrate 110 and a channel layer 112 made of GaN grown on the AlN nucleus forming layer 111. In such a case, the GaN channel layer 112 exposes the Ga-polar surface with preferable surface morphology. A conventional HEMT is usually formed on such a Ga-polar surface. The AlN nucleus forming layer 111 operates as a seed layer for growing the GaN channel layer 112 on the SiC substrate 110. The AlN nucleus forming layer 111 has a thickness of 10 to 20 nm, typically 15 nm. Because of lesser wettability of GaN against SiC, the GaN channel layer is hard or almost impossible to be grown directly on the SiC substrate. Accordingly, the AlN nucleus forming layer 111 is inevitable for the channel layer 112 made of GaN providing on the SiC substrate 110.

A reversed HEMT structure, where a barrier layer is provided under a channel layer, requires the barrier layer 12 with the N-polar surface. In order to induce the 2DEG 13a in the GaN channel layer next to the interface against the barrier layer 12, the channel layer 13 in a surface facing the barrier layer 12 is necessary or inevitable to be the Ga-polar surface while the barrier layer 12 in the interface against the channel layer 13 has the N-polar surface. In a case where the SiC substrate 120 has a surface with the crystallographic orientation of (000-1), namely the "–c" plane, such a configuration is hard to grow the AlN nucleus forming layer 111 and the GaN channel layer 122 with substantial crystal quality because the surface of the SiC substrate 120 with the crystallographic orientation of (000-1) shows lesser surface diffusion lengths of source materials of aluminum (Al), gallium (Ga), and/or nitrogen (N). An SiC substrate having a primary surface thereof with the crystallographic orientation offset from (0001) shows substantial surface diffusion lengths of the source materials. However, such a substrate with the offset primary surface decreases a number of substrates obtained from a unique ingot.

The present embodiment sequentially and epitaxially grows the oxide layer 16 containing Zn and the nitride semiconductor layer 11 on the primary surface 15a of the SiC substrate 15 having the crystallographic orientation of (0001), which enables the oxide layer 16 with the O-polar surface and the nitride semiconductor layer 11 with the N-polar surface. The oxide material containing Zn generally has the hexagonal crystal structure, exactly, the wurtzite type, with a lattice constant along the a-axis of 0.32496 nm, which is very close to that of the GaN with the lattice constant along the a-axis of 0.31885 nm. Thus, the oxide layer 16 containing Zn and the nitride semiconductor layer 11 form a hetero-interface with substantial crystal quality, and the surface of the nitride semiconductor layer 11 shows substantial morphology compared with that of the nitride semiconductor layer grown on the SiC substrate with crystallographic surface orientation of (000-1). Thus, the process according to the embodiment of the present invention may provide an epitaxial substrate 1A with the nitride semiconductor layer having the N-polar surface, which is applicable to the reversed HEMT. Also, because the nitride semiconductor layer 11 has substantial crystal quality, a buffer layer, or the nitride semiconductor layer 11, is unnecessary to be grown thick, which may effectively suppress a warp of the epitaxial substrate 1A. The oxide layer 16 containing Zn may be easily removed by, for instance, wet-etching, which means that the epitaxial layers, 11 to 13, may be easily detached from the substrate 15.

A normal HEMT provides a barrier layer on a channel layer and electrodes of a source and a drain on the barrier layer. Accordingly, a hetero-interface inevitably exists between the electrodes and the 2DEG in the channel layer, which becomes a barrier for carrier transportation and raises access resistance from the electrodes to the 2DEG. On the other hand, no hetero-interface exists between the electrodes and the 2DEG in a reversed HEMT of the present embodiment, which effectively reduces the access resistance from the electrodes to the 2DEG and enhances high frequency performance of the HEMT. Especially, in a HEMT with a smaller gate width to enhance a cut-off frequency $f_T$ for a current gain and a maximum oscillation frequency $f_{MAX}$ of a HEMT, the access resistance from the electrodes to the 2DEG becomes a dominant for internal resistance. Accordingly, a HEMT with the channel layer and the barrier layer reversing a stacking order thereof becomes effective for such a smaller gate width. Also, a reversed HEMT provides the barrier layer 12 with greater bandgap energy under the channel layer 13, namely, between the barrier layer 12 and the nitride semiconductor layer 11, which may effectively suppress a drain leak current flowing in the nitride semiconductor layer 11.

The oxide layer 16 may have a thickness of 200 to 400 nm, where an oxide layer 16 thicker than 200 nm may enhance crystal quality of the nitride semiconductor layer 11 grown thereon, while an oxide layer 16 thinner than 400 nm may save an elapsed time for the epitaxial growth. The nitride semiconductor layer 11 may have a thickness of 0.5 to 2.0 µm. A nitride semiconductor layer 11 with a thickness greater than 0.5 µm may enhance crystal quality of the barrier layer 12, while a nitride semiconductor layer with a thickness thinner than 2.0 µm, or preferably thinner than 1.5 µm may save an elapsed time for the epitaxial growth.

The channel layer 13 may have a thickness of 5 to 50 nm, preferably 5 to 20 nm. A channel layer 13 thicker than 5 nm, preferably 10 nm, may effectively induce the 2DEG, while a channel layer 13 thinner than 50 nm may reduce access resistance from the channel 13a, namely the 2DEG, to the electrodes of the source 22 and the drain 23, which becomes effective for a HEMT operable at higher frequencies.

The step of attaching the support substrate 10 to the semiconductor layers, 11 to 13, may use a Si wafer as the substrate 10 with an insulating film made of $SiO_2$ thereon. Because $SiO_2$ generally shows resistivity greater than resistivity of Si; the reliability of the epitaxial substrate 1A, or the HEMT 2A, may be enhanced. Also, the oxide film 16 may be easily removed by wet-etching using a solution of phosphoric peroxide.

Second Embodiment

Figure 6:
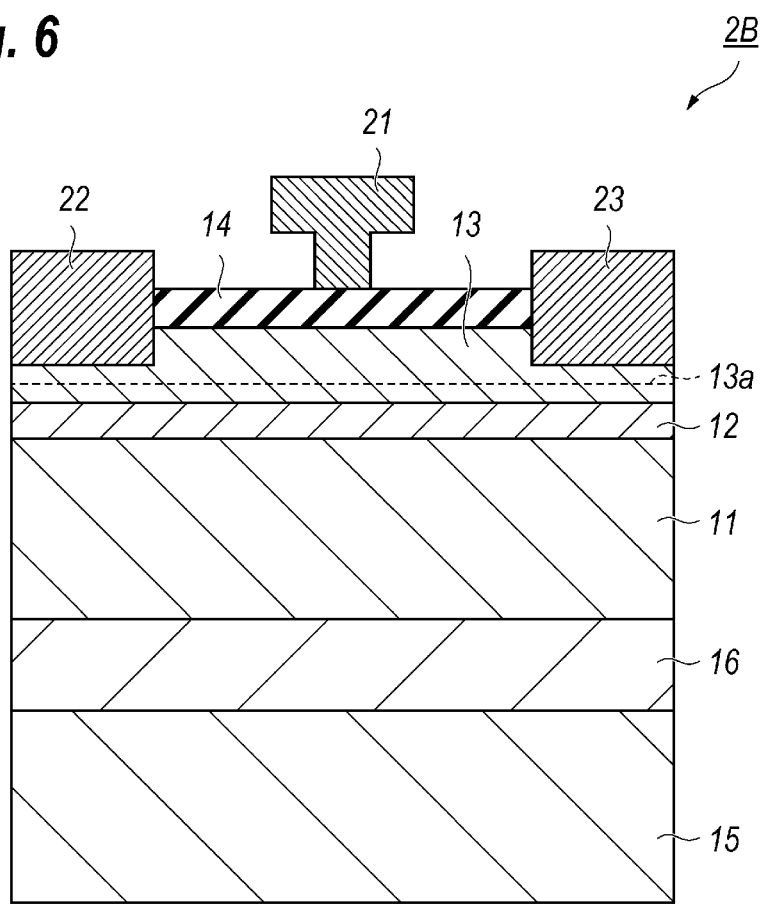
FIG. 6 schematically illustrates a cross section of another HEMT according to the second embodiment of the present invention.

FIG. 6 schematically illustrates a cross section of another HEMT 2B according to the second embodiment of the present invention. The HEMT 2B has a feature distinguishable from the HEMT 1A of the first embodiment is arrangements under the nitride semiconductor layer 11. That is, the HEMT 2B substitutes the substrate 15 and the oxide layer 16 for the support substrate 10, where the substrate 15 and the oxide layer 16 are prepared for growing the semiconductor layers, 11 to 13, thereon in the first embodiment. That is, the HEMT 2B of the second embodiment may be formed by omitting the step of attaching the temporal substrate 17 to the insulating film 14 shown in FIG. 3A, the step of removing the substrate 15 and the oxide layer 16 shown in FIG. 3B, and the step of attached the support substrate 10 to the nitride semiconductor layer 11 shown in FIG. 4B.

The HEMT 2B shown in FIG. 6 may have advantages same with those described for the HEMT 1B of the first embodiment. The oxide layer 16 possibly shows larger conductivity because vacancies for oxygen atoms behave as donors, which probably increases the drain leak current of the HEMT 2B. The leak current flowing in the oxide layer 16 may be effectively suppressed by an arrangement where the oxide layer 16 includes at least one of magnesium (Mg) and cadmium (Cd). In an example, the oxide layer 16 preferably has a portion made of ZnMgO initially grown on the substrate 15.

While particular embodiments of the present invention have been described herein for purposes of illustration, many modifications and changes will become apparent to those skilled in the art. For instance, the embodiments thus described provide the nitride semiconductor layer 11 made of GaN, the barrier layer 12 made of AlGaN, InAlN, InAlGaN, and so on, and the channel layer 13 made of GaN. However, the HEMTs, 2A and 2B, may provide the semiconductor layers, 11 to 13, made of other nitride semiconductor materials as long as the barrier layer 12 has bandgap energy greater than that of the nitride semiconductor layer 11 and the channel layer 13. Also, the embodiment grows the oxide layer 16 directly on the temporal substrate 15. However, the oxide layer 16 may be grown indirectly on the temporal substrate 15 interposing another semiconductor layer therebetween. Also, the embodiments grow the nitride semiconductor layer 11 directly on the oxide layer 16. However, the nitride semiconductor layer 11 may be grown indirectly on the oxide layer 15 interposing another nitride semiconductor layer 11 therebetween. Accordingly, the appended claims are intended to encompass all such modifications and changes as fall within the true spirit and scope of this invention.

What is claimed is:

1. A process of forming an epitaxial substrate, comprising steps of:
   epitaxially growing an oxide layer containing zinc (Zn) on a substrate, the oxide layer showing an O-polar surface;
   epitaxially growing a semiconductor stack made of nitride semiconductor materials on the oxide layer, the semiconductor stack including a nitride semiconductor layer, a barrier layer, and a channel layer, the barrier layer having bandgap energy greater than bandgap energy of the nitride semiconductor layer and bandgap energy of the channel layer, the semiconductor stack showing an N-polar surface;
   attaching a temporal substrate to the semiconductor stack;
   removing the substrate and the oxide layer from the semiconductor stack;
   attaching a support substrate to the nitride semiconductor layer; and
   removing the temporal substrate from the semiconductor stack.

2. The process according to claim 1,
   wherein the step of removing the substrate and the oxide layer is carried out by wet-etching the oxide layer by at least one of a solution of phosphoric peroxide, a solution of atonic acid, and acetic acid.

3. The process according to claim 1,
   wherein the temporal substrate and the support substrate are made of silicon (Si) and
   wherein the step of attaching the temporal substrate is carried out by adhesive applying between the semiconductor stack and the temporal substrate.

4. The process according to claim 3,
   wherein the step of removing the temporal substrate includes steps of:
   melting the adhesive; and
   cleaning a surface of the channel layer.

5. The process according to claim 3,
   wherein the support substrate provides a silicon oxide layer on a surface thereof, and
   wherein the step of attaching the support substrate is carried out such that the silicon oxide layer is in contact with the nitride semiconductor layer.

6. The process according to claim 1,
   wherein the oxide layer includes at least one of magnesium (Mg) and cadmium (Cd) in addition to Zn.

7. The process according to claim 1,
   wherein the oxide layer has a thickness of 200 to 400 nm.

8. The process according to claim 1,
   wherein the nitride semiconductor layer is made of gallium nitride (GaN) with a thickness of 0.5 to 2.0 µm.

9. The process according to claim 1,
   wherein the barrier layer has a thickness of 10 to 50 nm.

10. The process according to claim 1,
    wherein the step of epitaxially growing the semiconductor stack includes steps of:
    epitaxially growing a first portion of the nitride semiconductor layer at a first temperature; and
    epitaxially growing a second portion of the nitride semiconductor layer at a second temperature that is higher than the first temperature.

11. The process according to claim 10,
    wherein the step of forming epitaxially growing the semiconductor stack includes a step of growing the barrier layer at the second temperature.

12. The process according to claim 11,
    wherein the second temperature is 900 to 1100° C.

13. The process according to claim 10,
    wherein the steps of growing the nitride semiconductor layer in the first portion thereof is carried out by nitrogen ($N_2$) as a carrier gas and in the second portion thereof is carried out by hydrogen ($H_2$) as the carrier gas.

14. The process according to claim 1,
    wherein the step of growing the oxide layer includes steps of:
    growing a first portion of the oxide layer at a temperature lower than 300° C., and growing a second portion of the oxide layer at a temperature of 650 to 750° C.

15. A process of forming a high electron mobility transistor (HEMT), comprising steps of:
- preparing an epitaxial substrate by a process claimed in claim 1;
- covering the semiconductor stack by an insulating film on the channel layer;
- partially removing the insulating film and the channel layer;
- forming a source electrode and a drain electrode on the channel layer exposed by the step of partially removing the insulating film and the channel layer; and
- forming a gate electrode on the insulating film formed on the semiconductor stack between the source electrode and the drain electrode.

16. A process of forming a high electron mobility transistor (HEMT), comprising steps of:
- epitaxially growing an oxide layer containing zinc (Zn) on a substrate, the oxide layer showing an O-polar surface;
- epitaxially growing a semiconductor stack made of nitride semiconductor materials on the oxide layer, the semiconductor stack including a nitride semiconductor layer, a barrier layer, and a channel layer, the barrier layer having bandgap energy greater than bandgap energy of the nitride semiconductor layer and bandgap energy of the channel layer, the semiconductor stack showing a N-polar surface;
- covering the semiconductor stack with an insulating film;
- partially removing the insulating film and the channel layer;
- forming a source electrode and a drain electrode on the channel layer exposed by the step of partially removing the insulating film and the channel layer; and
- forming a gate electrode on the insulating film for flied on the semiconductor stack between the source electrode and the drain electrode.

* * * * *